US010673002B2

(12) United States Patent
Hara et al.

(10) Patent No.: US 10,673,002 B2
(45) Date of Patent: Jun. 2, 2020

(54) ORGANIC PHOTOELECTRIC CONVERSION ELEMENT AND METHOD FOR PRODUCING SAME

(71) Applicant: HAMAMATSU PHOTONICS K.K., Hamamatsu-shi, Shizuoka (JP)

(72) Inventors: Shigeo Hara, Hamamatsu (JP); Wataru Akahori, Hamamatsu (JP); Takahiko Yamanaka, Hamamatsu (JP); Tadataka Edamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/489,776

(22) Filed: Apr. 18, 2017

(65) Prior Publication Data
US 2017/0309850 A1  Oct. 26, 2017

(30) Foreign Application Priority Data
Apr. 20, 2016 (JP) ................................. 2016-084675

(51) Int. Cl.
*H01L 51/42* (2006.01)
*H01L 51/00* (2006.01)

(52) U.S. Cl.
CPC ...... *H01L 51/4273* (2013.01); *H01L 51/4293* (2013.01); *H01L 51/0007* (2013.01);
(Continued)

(58) Field of Classification Search
CPC ............................................. H01L 51/42–448
See application file for complete search history.

(56) References Cited

U.S. PATENT DOCUMENTS 6,340,789 B1 * 1/2002 Petritsch ............ H01L 51/0024
136/255
2005/0224113 A1 * 10/2005 Xue ...................... B82Y 10/00
136/263
(Continued)

FOREIGN PATENT DOCUMENTS

JP  2009-514184   4/2009
JP  2012-004299 A   1/2012
(Continued)

OTHER PUBLICATIONS

Fullerene C60-99.5% MSDS, Sigma Aldrich.*
(Continued)

*Primary Examiner* — Eric R Smith
(74) *Attorney, Agent, or Firm* — Faegre Drinker Biddle & Reath LLP

(57) ABSTRACT

Organic photoelectric conversion element has a first electrode, a photoelectric conversion layer, and a second electrode. The photoelectric conversion layer has a first organic layer that contains a first organic semiconductor containing principally a p-type organic semiconductor, a second organic layer that contains a second organic semiconductor containing principally an n-type organic semiconductor, and an intermediate layer that contains the first organic semiconductor and the second organic semiconductor. The second organic layer is disposed at a side of the second electrode relative to the first organic layer. The intermediate layer is between the first organic layer and the second organic layer and reaches each of these layers. The thickness of the second organic layer is greater than the sum of the thicknesses of the first organic layer and intermediate layer.

17 Claims, 6 Drawing Sheets

(52) U.S. Cl.
CPC ...... *H01L 51/0036* (2013.01); *H01L 51/0043* (2013.01); *H01L 51/0047* (2013.01); *Y02E 10/549* (2013.01); *Y02P 70/521* (2015.11)

(56) References Cited

U.S. PATENT DOCUMENTS

| | | | | |
|---|---|---|---|---|
| 2010/0294351 | A1* | 11/2010 | Holmes | H01L 51/4253 136/255 |
| 2011/0203649 | A1* | 8/2011 | Konemann | C07D 241/38 136/255 |
| 2013/0025685 | A1* | 1/2013 | Berson | B82Y 10/00 136/263 |

FOREIGN PATENT DOCUMENTS

| | | |
|---|---|---|
| JP | 2015-076557 A | 4/2015 |
| KR | 10-2013-0059994 A | 6/2013 |
| WO | WO 2005/004252 A2 | 1/2005 |
| WO | WO 2010/038721 A1 | 4/2010 |
| WO | WO 2015/045123 A1 | 4/2015 |

OTHER PUBLICATIONS

Copper(II) phthalocyanine-tetrasulfonic acid tetrasodium salt—Dye content—50% MSDS, Sigma Aldrich.*
Rose bengal—Dye content 95% MSDS, Sigma Aldrich.*
Copper(II) phthalocyanine—Dye content >99% MSDS, Sigma Aldrich.*
L. Chen et al., Improvement of the efficiency of CuPc/C60-based photovoltaic cells using a multistepped structure, Organic Electronics 10, p. 724-728 (Year: 2009).*
B. Pradhan and A. J. Pal, Organic photovoltaic devices: Concentration gradient of donor and acceptor materials in the molecular scale, Synthetic Metals 155, p. 555-559 (Year: 2005).*
Long Ye, et al., "From Binary to Ternary Solvent: Morphology Fine-tuning of D/A Blends in PDPP3T-based Polymer Solar Cells," Advanced Materials, 2012, 24, pp. 6335-6341.
Liu et al., "Sequential Deposition: Optimization of Solvent Swelling for High-Performance Polymer Solar Cells", ACS Applied Materials & Interfaces, DOI:10.1021/am506868g, Jan. 8, 2014, vol. 7, pp. 653-661-p.

* cited by examiner

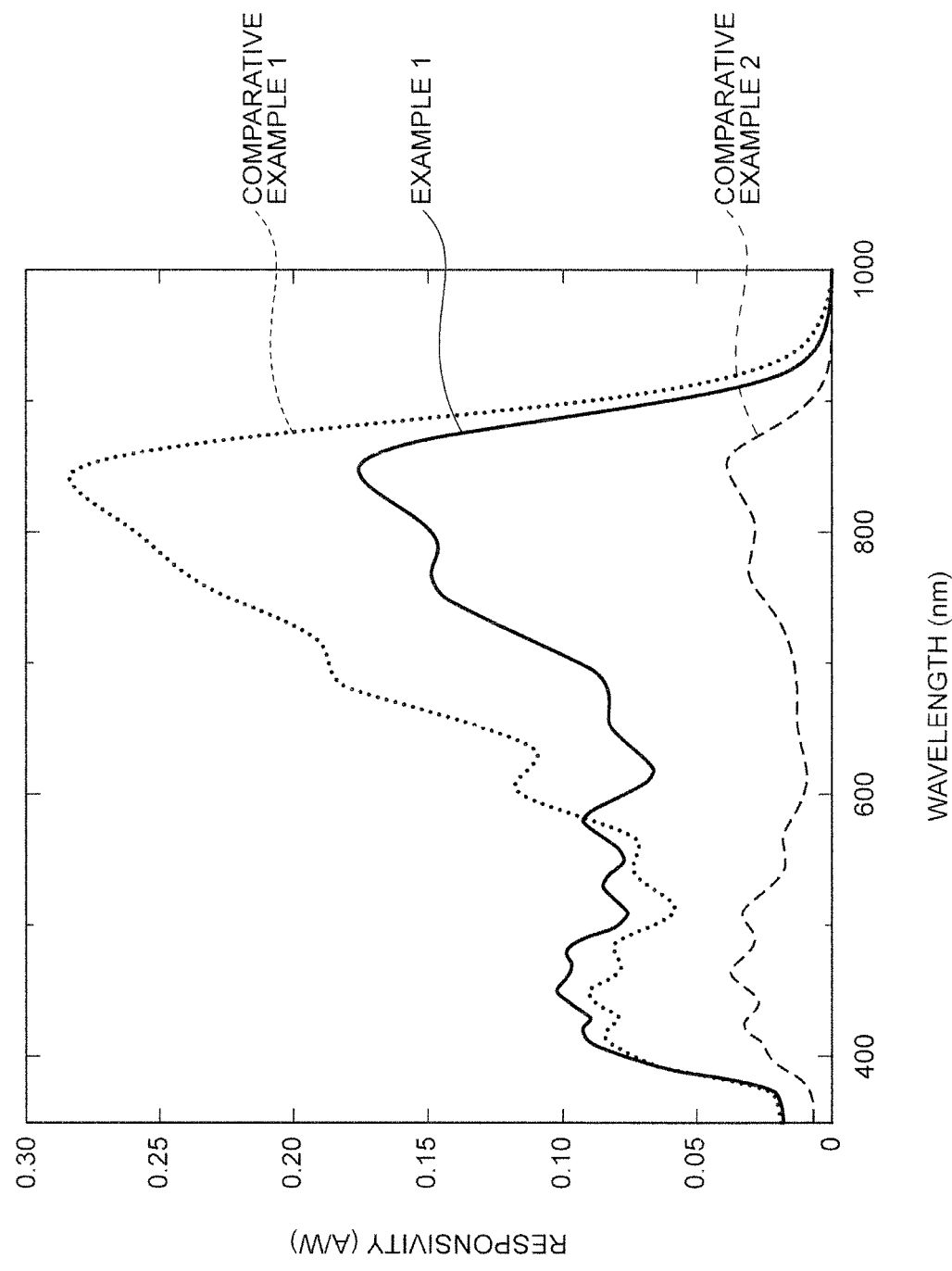

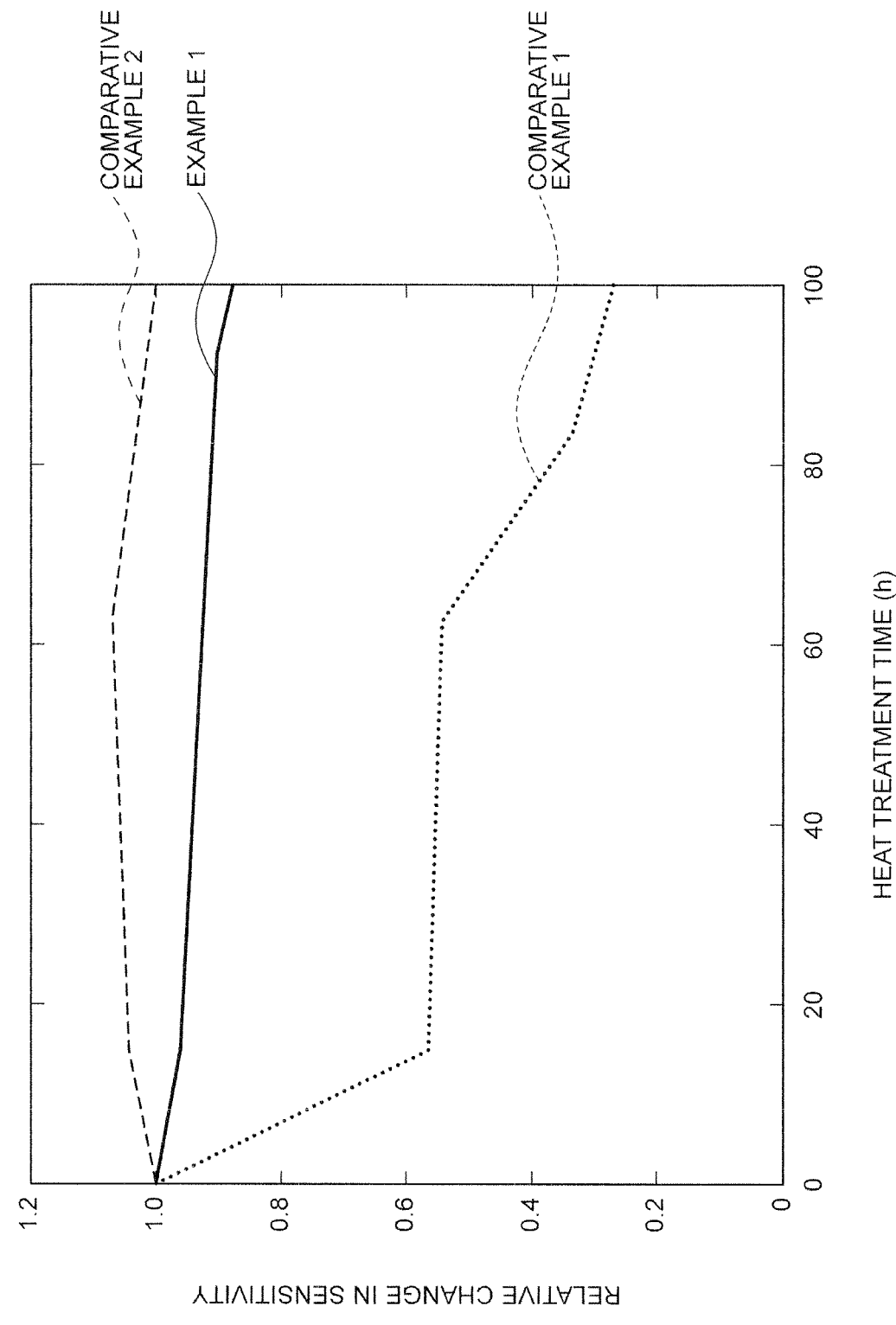

ORGANIC PHOTOELECTRIC CONVERSION ELEMENT AND METHOD FOR PRODUCING SAME

TECHNICAL FIELD

The present invention relates to an organic photoelectric conversion element and a method for producing the same.

BACKGROUND

As a photoelectric conversion element that is used in organic thin film solar batteries or the like, there has been conventionally known an organic photoelectric conversion element in which a photoelectric conversion layer containing an organic semiconductor is arranged between the respectively opposing electrodes (an electron capture electrode and a hole capture electrode). As a method for producing such an organic photoelectric conversion element, there is known a method in which a photoelectric conversion layer is formed by an application technique using a mixed solution obtainable from dissolving a p-type organic semiconductor and an n-type organic semiconductor in an appropriately selected solvent. Following this method, it is possible to form in the photoelectric conversion layer, a bicontinuous structure (bulk heterojunction structure) that is continuous between the respectively opposing electrodes while forming an interface between the p-type organic semiconductor and the n-type organic semiconductor (p/n interface) with an adequate interfacial area; therefore, the method allows high sensitivity (photoelectric conversion efficiency) to be obtained. See, for example, Non-Patent Literature 1.

[Non-Patent Literature 1] Advanced Materials, 2012, 24, pp. 6335-6341

SUMMARY

However, there are cases where conventional organic photoelectric conversion elements such as the one described above do not produce sufficient heat resistance. By contrast, the present inventors found that the heat resistance of an organic photoelectric conversion element could be improved by raising the content ratio of the n-type organic semiconductor in an organic semiconductor; however, in this case, there was a problem that sufficient sensitivity could not be obtained.

The present invention has been made in view of these circumstances, and an object thereof is to provide an organic photoelectric conversion element that can intend to improve both of the heat resistance and the sensitivity and a method for its production.

The present inventors surmised that the cause of lowering the sensitivity is, in the case where the content ratio of the n-type organic semiconductor is raised, the fact that the bulk heterojunction structure comes to contain an excessive amount of the n-type organic semiconductor, reducing p/n interface, which is a carrier-generating source, and making it difficult to form a structure where the p-type organic semiconductor for the hole transport is continuous throughout to the hole capture electrode, and causing recombination of electrons (carrier) in the n-type organic semiconductor, which occupied the most part of the organic semiconductor, with the p-type organic semiconductor. As a result of diligent studies based on the surmise, it was found that when a layer of the p-type organic semiconductor was incorporated between a layer containing an excess of the n-type organic semiconductor and the hole capture electrode, the sensitivity could be improved while excellent heat resistance was maintained, which resulted in the completion of the present invention.

The organic photoelectric conversion element according to one aspect of the present invention comprises a first electrode, a photoelectric conversion layer disposed on the first electrode, and a second electrode disposed on the photoelectric conversion layer. In this organic photoelectric conversion element, the photoelectric conversion layer has a first organic layer comprising a first organic semiconductor and a second organic layer comprising a second organic semiconductor, the second organic layer being disposed at a side of the second electrode relative to the first organic layer, and an intermediate layer comprising the first organic semiconductor and the second organic semiconductor. The intermediate layer is between the first organic layer and the second organic layer and reaches each of the first organic layer and the second organic layer. The thickness of the second organic layer is greater than the sum of the thickness of the first organic layer and the thickness of the intermediate layer. The first organic semiconductor comprises principally a p-type organic semiconductor. The second organic semiconductor comprises principally an n-type organic semiconductor and comprises a p-type organic semiconductor.

This organic photoelectric conversion element has excellent heat resistance as compared with the conventional organic photoelectric conversion elements because the second organic semiconductor in the second organic layer comprises principally the n-type organic semiconductor and comprises the p-type organic semiconductor, and in addition, the thickness of this second organic layer is thicker than the sum of the thickness of the first organic layer and the thickness of the intermediate layer, both layers comprising the p-type organic semiconductor which is thought to be the cause of decreasing heat resistance. This organic photoelectric conversion element also has sufficient sensitivity. Although this cause is not necessarily clear, the present inventors surmise that the intermediate layer possessed by the photoelectric conversion layer is provided with a large number of p/n interfaces and the generation of carriers resulting from the charge separation is effectively carried out.

In one embodiment, the content of the n-type organic semiconductor in the second organic semiconductor is preferably greater than 75% by mass based on the total mass of the second organic semiconductor. In this case, the effect of improving the heat resistance will be remarkable.

In one embodiment, at least one of the first organic semiconductor and the second organic semiconductor may comprise a compound having a diketopyrrolopyrrole skeleton as the p-type organic semiconductor. In this case, the effect of improving the heat resistance will be remarkable.

In one embodiment, the second organic semiconductor may comprise a fullerene derivative. In this case, the effect of improving the heat resistance will be remarkable.

In one embodiment, the p-type organic semiconductor contained in the first organic semiconductor may be the same as the p-type organic semiconductor contained in the second organic semiconductor. In this case, since the formation of potential barrier can be prevented, the sensitivity tends to improve further.

In one embodiment, the organic photoelectric conversion element may further comprise an electron blocking layer disposed between the first electrode and the photoelectric conversion layer. In this case, the dark current of the organic photoelectric conversion element is caused to decrease, and the holes can effectively be transported to the first electrode, which is a hole capture electrode.

In one embodiment, the organic photoelectric conversion element may further comprise a hole blocking layer disposed between the photoelectric conversion layer and the second electrode. In this case, the dark current of the organic photoelectric conversion element is caused to decrease, and the electrons can effectively be transported to the second electrode, which is an electron capture electrode.

The method for producing an organic photoelectric conversion element according to one aspect of the present invention, which is a method for producing the organic photoelectric conversion element described above, the method comprising the steps of: applying a solution comprising the first organic semiconductor and a first solvent capable of dissolving the first organic semiconductor on the first electrode to form the first organic layer; and applying a solution comprising the second organic semiconductor and a second solvent capable of dissolving the first organic semiconductor and the second organic semiconductor to form the intermediate layer and the second organic layer. According to this production method, since the solution comprising the second solvent capable of dissolving the first organic semiconductor is used in forming the second organic layer, the first organic semiconductor that exists on the applied surface of the first organic layer dissolves into the solution when the solution is applied on the first organic layer, and the intermediate layer is formed at the interface between the first organic layer and the second organic layer.

The method for producing an organic photoelectric conversion element according to one aspect of the present invention, which is a method for producing the organic photoelectric conversion element described above, the method comprising the steps of: applying a solution comprising the second organic semiconductor and a third solvent capable of dissolving the second organic semiconductor on the second electrode to form the second organic layer; and applying a solution comprising the first organic semiconductor and a second solvent capable of dissolving the first organic semiconductor and the second organic semiconductor on the second organic layer to form the intermediate layer and the first organic layer. According to this production method, since the solution comprising the second solvent capable of dissolving the second organic semiconductor is used in forming the first organic layer, the second organic semiconductor that exists on the applied surface of the second organic layer dissolves into the solution when the solution is applied on the second organic layer, and the intermediate layer is formed at the interface between the first organic layer and the second organic layer.

In one embodiment, the second solvent may comprise at least one selected from the group consisting of chlorobenzene and o-dichlorobenzene. In this case, an excellent formability of the intermediate layer is obtained.

According to the present invention, there can be provided an organic photoelectric conversion element that can intend to improve both of the heat resistance and the sensitivity and a method for its production.

BRIEF DESCRIPTION OF THE DRAWINGS

FIG. 4 is a chart of sensitivity spectra of the Example and the Comparative Examples.

FIG. 6 is a graph showing the results of the heat resistance evaluation of the Example and the Comparative examples.

DETAILED DESCRIPTION

Embodiments of the present invention will be described hereinbelow with reference to the accompanying drawings. Dimensions and ratios in each drawing are not always in accord with the actual ones.

Organic Photoelectric Conversion Element

Figure 1:
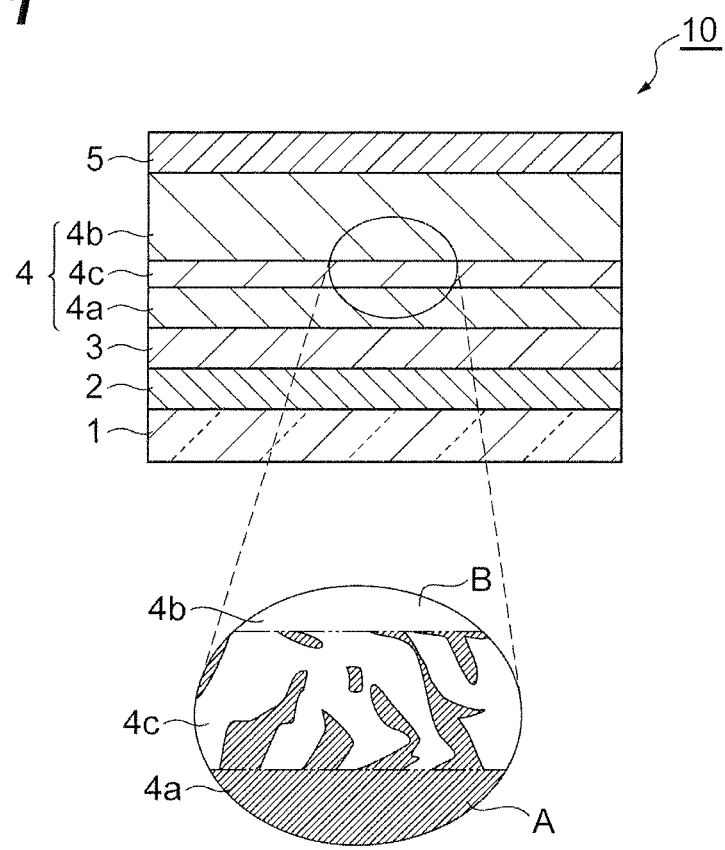
FIG. 1 is a cross-sectional view of an organic photoelectric conversion element according to one embodiment of the present invention.

As FIG. 1 shows, an organic photoelectric conversion element 10 comprises a substrate 1, a first electrode 2 disposed on the substrate 1, an electron blocking layer 3 disposed on the first electrode 2, a photoelectric conversion layer 4 disposed on the electron blocking layer 3, and a second electrode 5 disposed on the photoelectric conversion layer 4. The photoelectric conversion layer 4 comprises a first organic semiconductor A comprising a p-type organic semiconductor as well as a second organic semiconductor B comprising a p-type organic semiconductor and an n-type organic semiconductor.

The organic photoelectric conversion element 10 has the function of converting light into electric energy. Specifically, light transmits the side of the substrate 1 and enters the photoelectric conversion layer 4, and the p-type organic semiconductor or the n-type organic semiconductor contained in the photoelectric conversion layer 4 absorbs the light to generate excitons, where carriers (holes and electrons) are generated because the generated excitons undergo charge separation at the p/n interface. Between the holes and the electrons that are thus generated, the holes move to the first electrode 2 which is a hole capture electrode, and the electrons move to the second electrode 5 which is an electron capture electrode. The first electrode 2 and the second electrode 5 are then electrically connected to an external circuit or the like, whereby electric energy can be withdrawn from the organic photoelectric conversion element 10.

Note that the p-type organic semiconductor is a compound that generates holes (positive holes) at the p/n interface and has the function of furnishing electrons to the n-type organic semiconductor. Furthermore, the p-type organic semiconductor has the function of transporting the holes to the hole capture electrode (the first electrode 2, anode). Namely, the p-type organic semiconductor is a donor organic semiconductor and at the same time, a hole-transporting organic compound. Further, the n-type organic semiconductor is a compound that generates electrons at the p/n interface and has the function of receiving electrons from the p-type organic semiconductor. Furthermore, the n-type organic semiconductor has the function of transporting the electrons to the electron capture electrode (the second electrode 5, cathode). Namely, the n-type organic semiconductor is an acceptor organic semiconductor and at the same time, an electron-transporting compound.

The photoelectric conversion layer 4 has a first organic layer 4a comprising the first organic semiconductor A, a second organic layer 4b comprising a second organic semiconductor B, and an intermediate layer 4c comprising the first organic semiconductor A and the second organic semiconductor B. The thickness of the photoelectric conversion layer 4 may be from 70 to 370 nm, for example.

The first organic layer 4a is disposed closest to the side of the electron blocking layer 3 within the photoelectric conversion layer 4. The thickness of the first organic layer 4a may be from 5 to 20 nm, for example.

The first organic layer 4a may only consist of the first organic semiconductor A, or alternatively, it may contain components other than the first organic semiconductor A. Note that the "first organic semiconductor" represents the organic semiconductor contained in the first organic layer 4a and any organic semiconductor contained in the first organic layer 4a is all encompassed by the first organic semiconductor A.

The first organic semiconductor A comprises principally a p-type organic semiconductor. Specifically, the content of the p-type organic semiconductor in the first organic semiconductor is greater than 50% by mass based on the total mass of the first organic semiconductor A. In the present embodiment, since the photoelectric conversion layer 4 has the first organic layer 4a comprising the above-mentioned first organic semiconductor A, the structure where the p-type semiconductor is continuous throughout to the hole capture electrode can be formed in the photoelectric conversion layer. This can improve hole transportability as well as can improve the sensitivity. From the standpoint that the hole transport is effectively carried out, the content of the p-type organic semiconductor may be 80% by mass or more based on the total mass of the first organic semiconductor A. The upper limit of the content of the p-type organic semiconductor may be 100% by mass based on the total mass of the first organic semiconductor A. In other words, the first organic semiconductor A may only consist of the p-type organic semiconductor substantially. Note that the first organic semiconductor A is uniformly present in the first organic layer 4a. Specifically, the content of the p-type organic semiconductor as well as the content of the n-type organic semiconductor is constant in the first organic layer 4a.

As the p-type organic semiconductor contained in the first organic semiconductor A, there are, for example, mentioned compounds (e.g., polymer) having a skeleton that is derived from at least one compound selected from the group consisting of thiophene, benzothiophene, phenylenevinylene, carbazole, thienopyrrole, diketopyrrolopyrrole, and derivatives of the foregoing. When the first organic semiconductor A comprises a compound having a skeleton derived from diketopyrrolopyrrole or a derivative thereof (diketopyrrolopyrrole skeleton), the effect of improving the heat resistance tends to be more remarkable. Examples of the compound having a diketopyrrolopyrrole skeleton include PDPP3T (poly[(2,5-bis(2-hexyldeceyl)-2,3,5,6-tertahydro-3,6-dioxopyrrolo[3,4-c]pyrrole-1,4-diyl)-alt-((2,2':5',2''-terthiophene)-5,5''-diyl)]), PDPP4T (poly[(2,5-bis(2-octyldodecyl) pyrrolo[3,4-c]pyrrole-1,4(2H,5H)-dione-3, 6-diyl)-alt-(2,2'; 5',2'':5'',2'''-quaterthiophen-5,5'''-diyl)]), PMDPP3T (Poly [(2,5-bis(2-hexyldecyl)-2,3,5,6-tetrahydro-3,6-dioxopyrrolo [3,4-c] pyrrole-1,4-diyl)-alt-(3',3''-dimethyl-2,2':5',2''-terthiophene)5,5''-diyl]). One kind of compounds or plural kinds of compounds in combination can be used as the p-type organic semiconductor.

The first organic semiconductor A may further comprise an n-type organic semiconductor. As the n-type organic semiconductor which the first organic semiconductor may comprise, there is, for example, mentioned at least one compound selected from the group consisting of fullerene, a fullerene derivative, carbon nanotube, and a carbon nanotube derivative. Examples of the fullerene derivative include $PC_{61}BM$([6,6]-phenyl-$C_{61}$-methyl butyrate) and $PC_{71}BM$ ([6,6]-phenyl-$C_{71}$-methyl butyrate). Among these, the effect of improving the heat resistance tends to be more remarkable when the first organic semiconductor A comprises the fullerene derivative. One kind of compounds or plural kinds of compounds in combination can be used as the n-type organic semiconductor.

The second organic layer 4b is disposed closest to the side of the second electrode 5 within the photoelectric conversion layer 4. In other words, the second organic layer 4b is disposed at the side of the second electrode 5 relative to the first organic layer 4a. The thickness of the second organic layer 4b is greater than the sum of the thickness of the first organic layer 4a and the thickness of the intermediate layer 4c. Such a configuration maintains the effect of improving the heat resistance that results from a significant increase in the content ratio of the n-type organic semiconductor in the second organic layer 4b. From the standpoint of further improving the sensitivity, the thickness of the second organic layer 4b may be 50 nm or more, and 80 nm or more. From the standpoint of further improving the heat resistance, the thickness of the second organic layer 4b may be 300 nm or less, and 200 nm or less. In addition, from the standpoint of further improving the sensitivity, the sum of the thickness of the first organic layer 4a and the thickness of the intermediate layer 4c may be 10 nm or more, and 20 nm or more. From the standpoint of further improving the heat resistance, the sum of the thickness of the first organic layer 4a and the thickness of the intermediate layer 4c may be 40 nm or less, and 30 nm or less.

The second organic layer 4b comprises the second organic semiconductor B comprising the p-type organic semiconductor and the n-type organic semiconductor. In other words, the interface between the p-type organic semiconductor and the n-type organic semiconductor (p/n interface) is present within the second organic layer 4b. Therefore, the second organic layer 4b can generate carriers (electrons and holes) by the light that enters the organic photoelectric conversion element. Note that the "second organic semiconductor" represents the organic semiconductor contained in the second organic layer 4b and any organic semiconductor contained in the second organic layer 4b is all encompassed by the second organic semiconductor B.

The second organic layer 4b may only consist of the second organic semiconductor B, or alternatively, it may contain components other than the second organic semiconductor B.

The second organic semiconductor A comprises principally an n-type organic semiconductor. Specifically, the content of the n-type organic semiconductor in the second organic semiconductor B is greater than 50% by mass based on the total mass of the second organic semiconductor B. In the present embodiment, since the second organic layer 4b comprises the above-mentioned second organic semiconductor B, the heat resistance can be improved. From the standpoint of further improving the heat resistance, the content of the n-type organic semiconductor is preferably greater than 75% by mass, more preferably 80% by mass or more, and further preferably 90% by mass or more, based on the total mass of the second organic semiconductor B.

Conventionally, in order for the sensitivity to be maximum in the organic photoelectric conversion element 10 having a bulk heterojunction structure, it has been thought that the mass ratio of the n-type organic semiconductor to the p-type organic semiconductor (the mass of the n-type organic semiconductor/the mass of the p-type organic semiconductor) is desirably on the order of from 1 to 4. By contrast, in the present embodiment the heat resistance of the organic photoelectric conversion element can be further improved by increasing the content ratio of the n-type organic semiconductor significantly. For example, when the content of the n-type organic semiconductor is greater than 75% by mass, the heat resistance tends to be excellent as compared with the conventional organic photoelectric conversion elements. Furthermore, when the content of the n-type organic semiconductor is 90% by mass or more, the effect of improving the heat resistance will be far more remarkable; and excellent heat resistance can be exhibited in the heat resistance evaluation to be shown in the Examples. From the standpoint of excellent balance between the heat resistance and the sensitivity, the content of the n-type organic semiconductor may be 98% by mass or less and may be 95% by mass or less, based on the total mass of the second organic semiconductor B. When the content of the n-type organic semiconductor is 95% by mass or less, the balance between the heat resistance and the sensitivity will tend to be far more excellent. Considering these standpoints, the content of the n-type organic semiconductor may be greater than 75% by mass and 98% by mass or less, 80% by mass or more and 98% by mass or less, 90% by mass or more and 98% by mass or less, or 90% by mass or more and 95% by mass or less, based on the total mass of the second organic semiconductor B. When the content of the n-type organic semiconductor is greater than 75% by mass and 98% by mass or less, sufficient heat resistance and sensitivity can be compatible. Further, when the content of the n-type organic semiconductor is 90% by mass or more and 98% by mass or less, the heat resistance and the sensitivity can be compatible in a high level. Furthermore, when the content of the n-type organic semiconductor is 90% by mass or more and 95% by mass or less, the heat resistance and the sensitivity can be compatible in a higher level. Note that the second organic semiconductor B is uniformly present in the second organic layer 4b. Specifically, the content of the p-type organic semiconductor and the content of the n-type organic semiconductor are constant in the second organic layer 4b.

As for the examples of the p-type organic semiconductor and the n-type organic semiconductor contained in the second organic semiconductor B, there can be mentioned those which are the same as the examples of the p-type organic semiconductor and the n-type organic semiconductor contained in the first organic semiconductor A as described above. When the second organic semiconductor B comprises a compound having a diketopyrrolopyrrole skeleton as the p-type organic semiconductor, the effect of improving the heat resistance tends to be far more remarkable. When the second organic semiconductor B comprises a fullerene derivative as the n-type organic semiconductor, the effect of improving the heat resistance tends to be far more remarkable. In the second organic semiconductor B, one kind of compounds or plural kinds of compounds in combination can be used, respectively, for the p-type organic semiconductor and the n-type organic semiconductor.

The p-type organic semiconductor contained in the second organic semiconductor B may be the same as or different from the p-type organic semiconductor contained in the first organic semiconductor A. When the p-type organic semiconductor contained in the second organic semiconductor B is the same as the p-type organic semiconductor contained in the first organic semiconductor A, the formation of potential barrier can be prevented and the charge separation in the intermediate layer 4c can be carried out effectively; therefore, the sensitivity tends to improve further.

When the first organic semiconductor A contains an n-type organic semiconductor, the n-type organic semiconductor contained in the second organic semiconductor B may be the same as or different from the n-type organic semiconductor contained in the first organic semiconductor A. When the n-type organic semiconductor contained in the second organic semiconductor B is the same as the n-type organic semiconductor contained in the first organic semiconductor A, the formation of potential barrier can be prevented and the charge separation in the intermediate layer 4c can be carried out effectively; therefore, the sensitivity tends to improve further.

The intermediate layer 4c is a layer that is in between the first organic layer 4a and the second organic layer 4b and that reaches each of the first organic layer 4a and the second organic layer 4b. The above-mentioned intermediate layer 4c is a layer that is formed by applying on the surface of the first organic layer 4a opposite to the first electrode 2, a solution comprising the second organic semiconductor and a solvent capable of dissolving the first organic semiconductor and the second organic semiconductor and by dissolving the first organic semiconductor of the first organic layer 4a that is present on the surface opposite to the first electrode 2 into the solution. The intermediate layer 4c can be expressed as a region where the first organic semiconductor and the second organic semiconductor coexist at the interface between the first organic layer 4a and the second organic layer 4b. Nevertheless, the intermediate layer 4c is not limited to a layer obtained by the above-mentioned method. For example, the intermediate layer 4c may be a layer that is formed by applying on the surface of the second organic layer 4b opposite to the second electrode 5, a solution comprising the first organic semiconductor and a solvent capable of dissolving the first organic semiconductor and the second organic semiconductor and by dissolving the second organic semiconductor of the second organic layer 4b that is present on the surface opposite to the second electrode 5 into the solution. For example, the intermediate layer 4c may be a layer that is formed by applying on the surface of the first organic layer 4a opposite to the first electrode 2 or on the surface of the second organic layer 4b opposite to the second electrode 5, a solution comprising the first organic semiconductor and the second organic semiconductor.

The present inventors surmise that since the photoelectric conversion layer 4 has the intermediate layer 4c described above, the sensitivity of the organic photoelectric conversion element 10 can improve. Specifically, in the present embodiment, it is thought that a large number of the p/n interface is present in the intermediate layer 4c comprising the first organic semiconductor A and the second organic semiconductor B, since the first organic semiconductor A comprises principally the p-type organic semiconductor and the second organic semiconductor B comprises principally the n-type organic semiconductor. It is then surmised that since the charge separation at the p/n interfaces can generate a large number of carriers (electrons and holes), the sensitivity of the organic photoelectric conversion element 10 can improve according to the present embodiment.

The thickness of the intermediate layer 4c may be from 5 to 20 nm, for example. When the thickness of the intermediate layer 4c is smaller than that of the first organic layer 4a, the sensitivity tends to improve further. The intermediate layer 4c shown in FIG. 1 has the first organic semiconductor A more in a region at the side of the first electrode 2 and has the second organic semiconductor B more in a region at the side of the second electrode 5. More specifically, in the intermediate layer 4c, the amount of the first organic semiconductor A decreases, while the amount of the second organic semiconductor B increases as the region approaches from the side of the first electrode 2 to the side of the second electrode 5. Since the intermediate layer 4c has the above-mentioned configuration, the effects of improving the heat resistance and the sensitivity tend to be far more excellent. Furthermore, the intermediate layer 4c has the p-type organic semiconductor more in a region at the side of the first electrode 2 and has the n-type organic semiconductor more in a region at the side of the second electrode 5. More specifically, in the intermediate layer 4c, the amount of the p-type organic semiconductor decreases, while the amount of the n-type organic semiconductor increases as the region approaches from the side of the first electrode 2 to the side of the second electrode 5. Since the intermediate layer 4c has the above-mentioned configuration, the effects of improving the heat resistance and the sensitivity tend to be far more excellent.

The content ratio (mass ratio) of the first organic semiconductor A to the second organic semiconductor B in the intermediate layer 4c is not particularly limited. For example, the mass ratio of the first organic semiconductor A to the second organic semiconductor B may be from 0.2 to 5 and may be 1. Also, it is sufficient that the intermediate layer 4c contains more p-type organic semiconductor than does the second organic layer 4b; as long as this is satisfied, the content ratio (mass ratio) of the p-type organic semiconductor to the n-type organic semiconductor in the intermediate layer 4c is not particularly limited. For example, the mass ratio of the p-type organic semiconductor to the n-type organic semiconductor in the intermediate layer 4c may be from 0.25 to 2.5. Note that the content ratio (mass ratio) of the p-type organic semiconductor to the n-type organic semiconductor in the intermediate layer 4c is dependent on the content ratio (mass ratio) of the p-type organic semiconductor to the n-type organic semiconductor in the first organic semiconductor A and the content ratio (mass ratio) of the p-type organic semiconductor to the n-type organic semiconductor in the second organic semiconductor B.

From the standpoint of allowing light to enter effectively, the substrate 1 is preferably transparent to the incident light. The substrate 1 may be a glass substrate or a transparent resin film, for example. Examples of the glass substrate include quartz glass, synthetic quartz glass, and Pyrex glass ("Pyrex" is a registered trademark). Examples of the transparent resin film include a PET film, a PEN film, and a polyimide film. When the substrate 1 is the resin film, it is preferably one having water vapor barrier property; and it is more preferably one having water vapor permeability of $10^{-3}$ g/m²·day or less from the standpoint of extending the lifetime of the organic photoelectric conversion element 10. As the resin film having the water vapor barrier property (water vapor barrier film), there are, for example, mentioned films the surfaces of which are deposited with a $S_iO_2$ film, a $S_iN$ film, or the like.

The first electrode 2 is an electrode that captures holes generated at the p/n interface (hole capture electrode). The first electrode 2 is in contact with the substrate 1. The thickness of the first electrode 2 is from 50 to 300 nm, for example. From the standpoint of allowing light to enter, the first electrode 2 is preferably transparent to the incident light. The constituent material of the first electrode 2 is preferably ITO from the standpoint of its being excellent in the transparency of the first electrode 2.

The second electrode 5 is an electrode that captures electrons generated at the p/n interface (electron capture electrode). The second electrode 5 is in contact with the photoelectric conversion layer 4. The thickness of the first electrode 2 is from 50 to 300 nm, for example. As for the constituent material of the second electrode 5, there are, for example, mentioned In, Al, Ca, Mg, Cr, and the like; and from the standpoint of the ease of handling, Al is preferable.

The electron blocking layer 3 is a layer that can only transport holes between the carriers. The electron blocking layer 3 is in contact with each of the first electrode 2 and the photoelectric conversion layer 4. In the present embodiment, the organic photoelectric conversion element 10 comprises the electron blocking layer 3 between the first electrode 2 and the photoelectric conversion layer 4; thereby, the dark current in the organic photoelectric conversion element 10 is caused to decrease and the holes can effectively be transported to the first electrode 2 which is the hole capture electrode. The thickness of the electron blocking layer 3 is from 5 to 40 nm, for example. As for the constituent material of the electron blocking layer 3, there are mentioned, for example, metal oxides such as NiO and $MoO_3$ and conductive polymers such as PEDOT/PSS (poly(3,4-ethylenedioxythiophene)/poly(4-styrene sulfonate). NiO is preferable from the standpoint of its being excellent in heat resistance and transparency, One embodiment of the organic photoelectric conversion element according to the present invention has been described above; however, the present invention is not limited to the above-described embodiment.

For example, the respective sizes (areas of the principal faces) of the substrate 1, the first electrode 2, the electron blocking layer 3, the photoelectric conversion layer 4, and the second electrode 5 may differ. For example, the first electrode 2 may be disposed only on a partial area of the substrate 1, and the second electrode 5 may be disposed only on a partial area of the photoelectric conversion layer 4.

Also, when the electron blocking layer 3 is comprised of a metal oxide such as NiO, the surface of the electron blocking layer 3 at the side of the second electrode 5 may be surface-treated by UV ozone treatment or the like. This improves the energy level and the sensitivity tends to improve further.

Further, the organic photoelectric conversion element does not need to comprise the electron blocking layer 3. Namely, the photoelectric conversion layer 4 may be in contact with the first electrode 2.

Furthermore, the organic photoelectric conversion element may comprise other layers except the photoelectric conversion layer 4 and the electron blocking layer 3. The other layers may be formed between the first electrode 2 and the photoelectric conversion layer 4. As such a layer, there is mentioned a hole transporting layer, for example. When the organic photoelectric conversion element comprises the electron blocking layer 3, the hole transporting layer may be disposed between the first electrode 2 and the electron blocking layer 3 or between the electron blocking layer 3 and the photoelectric conversion layer 4. The other layer may be formed between the second electrode 5 and the photoelectric conversion layer 4. As such a layer, there are mentioned an electron transporting layer and a hole blocking layer, for example. When the organic photoelectric conversion element comprises the electron transporting layer and the hole blocking layer, the electron transporting layer may be disposed on the hole blocking layer, or alternatively, the hole blocking layer may be disposed on the electron blocking layer. The other layer may be disposed on the second electrode 5. As such a layer, there is mentioned a layer having water vapor barrier property, for example. The layer having water vapor barrier property may be the water vapor barrier film described above, for example.

Still further, the organic photoelectric conversion element does not need to comprise a substrate 1. Moreover, the substrate 1 may be disposed on the second electrode 5. In this case, the substrate 1 does not need to be transparent. Also, in this case, the first electrode 2 may be disposed on the layer having water vapor barrier property described above.

Figure 2:
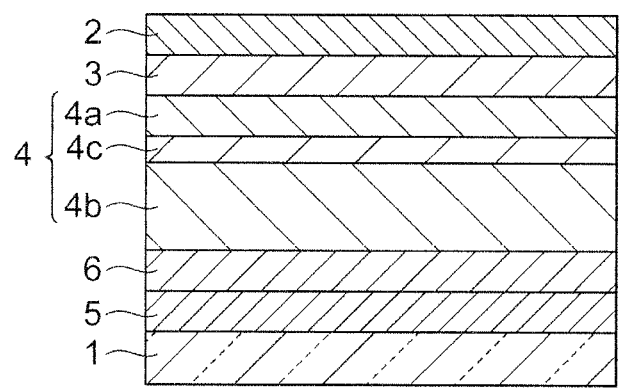
FIG. 2 is a cross-sectional view of an organic photoelectric conversion element according to another embodiment of the present invention.

Furthermore, the organic photoelectric conversion element may be designed such that it allows light to enter from the side of the second electrode 5. For example, as is shown in FIG. 2, the organic photoelectric conversion element may be such that it comprises a substrate 1, a second electrode 5 disposed on the substrate 1, a hole blocking layer 6 disposed on the second electrode 5, a photoelectric conversion layer 4 disposed on the hole blocking layer 6, an electron blocking layer 3 disposed on the photoelectric conversion layer 4, and a second electrode 5 disposed on the electron blocking layer 3. In this case, from the standpoint of allowing light to enter effectively, the substrate 1 and the second electrode 5 are preferably transparent to the incident light. As for the constituent material of such second electrode 5, there is mentioned ITO, for example. Further, in this case, the first electrode 2 does not need to be transparent. As for the constituent material of such first electrode 2, there are mentioned Al, Au, Ag, Co, Ni, and the like, for example. Furthermore, in this case, it is preferred that the hole blocking layer 6 be preferably provided between the second electrode 5 and the photoelectric conversion layer 4, as is shown in FIG. 2. Because of the hole blocking layer 6 being provided, the dark current in the organic photoelectric conversion element is caused to decrease and the electrons can effectively be transported to the second electrode which is the electron capture electrode. It is more preferred that the hole blocking layer 6 be provided between the second electrode 5 and the photoelectric conversion layer 4, and that the electron blocking layer 3 be provided between the first electrode 2 and the photoelectric conversion layer 4.

The organic photoelectric conversion element that is configured as described above can be, for example, used as an member of an organic thin film solar battery, an illuminometer, a color sensor, a range-finding sensor, a motion sensor, a fingerprint authentication sensor, a vein authentication sensor, an image sensor, a pulse sensor, a blood pressure measuring instrument, a blood oxygen saturation measuring instrument, a blood lipid measuring instrument, a glucometer, a biological light measuring instrument, a gas sensor, or the like. When the organic photoelectric conversion element is used in the organic thin film solar battery, a plurality of the organic photoelectric conversion elements according to the present embodiment may be arranged in a two-dimensional manner to construct the solar battery.

Production Method

In a method for producing the organic photoelectric conversion element 10 according to the present embodiment, a substrate 1 is provided and a first electrode 2 is formed on the substrate 1. The method of forming the first electrode 2 can appropriately be selected, depending on the constituent material of the first electrode 1. For example, when ITO is used, the first electrode 2 may be formed by sputtering or the like. In addition, when Au, Ag, Co, Ni, or the like is used, the first electrode 2 may be formed by drawing mesh-like thin lines on the substrate 1 according to a printing method.

Figure 3A:
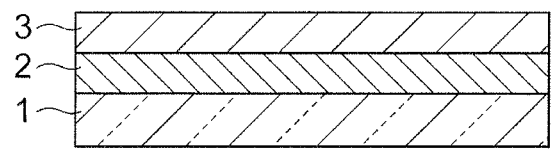
FIGS. 3A, 3B, 3C and 3D are diagrams illustrating a method for producing an organic photoelectric conversion element according to one embodiment of the present invention.

Next, an electron blocking layer 3 is formed on the first electrode 2 [FIG. 3A]. The method of forming the electron blocking layer 3 can appropriately be selected, depending on the constituent material of the electron blocking layer 3. For example, when a conductive polymer is used, the electron blocking layer 3 may be formed by an application method such as spin coating. In addition, when a metal oxide such as NiO is used, the electron blocking layer 3 may be formed by a vacuum film forming method such as electron-beam deposition or resistance heating deposition. In this case, after the blocking layer 3 is formed, the surface of the blocking layer 3 that is opposite to the first electrode 2 may be treated by UV ozone treatment or the like.

Figure 3B:
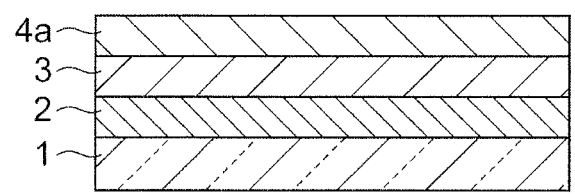

Subsequently, a first organic layer 4a is formed on the electron blocking layer 3 [FIG. 3B]. Specifically, a first application solution comprising the first organic semiconductor A and a first solvent capable of dissolving the first organic semiconductor A is first prepared. Next, the first application solution is applied on the surface of the blocking layer 3 that is opposite to the first electrode 2, and then, the first solvent is removed by drying. This forms the first organic layer 4a.

Although the first organic layer A is preferably dissolved in the first application solution completely, it may be sufficient that at least a part thereof is dissolved in the first application solution. The concentration of the first organic semiconductor A in the first application solution may be appropriately selected, depending on the viscosity of the first application solution or the like: for example, it may be from 1 to 20 mg/ml.

As the first solvent, there is mentioned a solvent comprising at least one selected from the group consisting of chlorobenzene, o-dichlorobenzene, chloroform, and toluene. Among these, chlorobenzene, o-dichlorobenzene, or chloroform is preferable, and chlorobenzene or o-dichlorobenzene is more preferable from the standpoint of excellent dissolvability of the first organic semiconductor A. One kind of compounds or plural kinds of compounds in combination can be used as the first solvent.

As the method of applying the first application solution, there are, for example, mentioned a variety of methods, such as spin coating, dip coating, die coating, screen printing, and gravure printing.

Heat treatment or the like may be carried out after the formation of the first organic layer 4a and before the formation of the intermediate layer 4c and the second first organic layer 4b. This can improve the electron transport property of the first organic layer 4a.

Figure 3C:
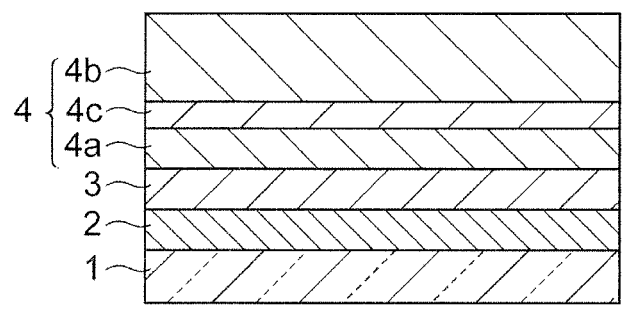
Figure 3D:
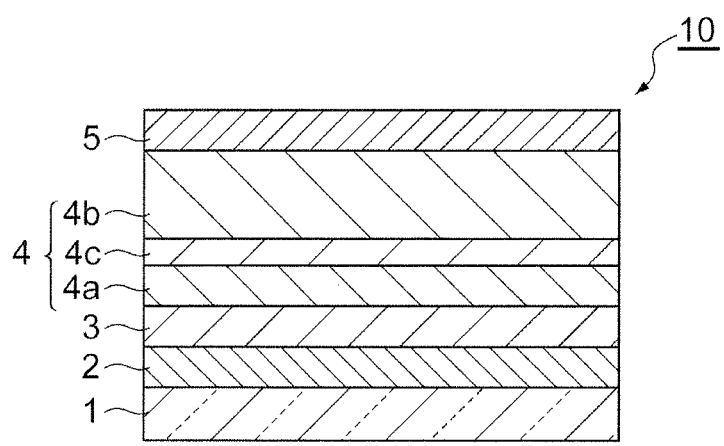

Subsequently, the intermediate layer 4c and the second organic layer 4b are formed on the first organic layer 4a [FIG. 3C]. Specifically, a second application solution comprising the second organic semiconductor B and a second solvent capable of dissolving the first organic semiconductor A and the second organic semiconductor B is first prepared. Next, the second application solution is applied on the surface of the first organic layer 4a that is opposite to the first electrode 2, and then, the second solvent is removed by drying. This forms the intermediate layer 4c and the second organic layer 4b. In the present embodiment, since the second application solution contains the p-type organic semiconductor, the second application solution can be uniformly applied on the surface of the first organic layer 4a.

In the aforementioned step, the second application solution contains the second solvent capable of dissolving the first organic semiconductor A; therefore, by applying the second application solution on the first organic layer 4a, the first organic semiconductor A that exists on the application surface of the first organic layer 4a dissolves into the second application solution. Consequently, the intermediate layer 4c comprising the first organic semiconductor A and the second organic semiconductor B is formed at the interface between the first organic layer 4a and the second organic layer 4b. In the present embodiment, it is preferred that treatment such as insolubilization is not conducted against the application surface of the first organic layer 4a from the stand point of forming the intermediate layer 4c adequately.

Although the second organic layer B is preferably dissolved in the second application solution completely, it may be sufficient that at least a part thereof is dissolved in the second application solution. The concentration of the second organic semiconductor B in the second application solution may be appropriately selected, depending on the viscosity of the second application solution or the like: for example, it may be from 1 to 60 mg/ml.

Examples of the second solvent include the same ones as those of the first solvent. The second solvent may be the same as or different from the first solvent. The second solvent is preferably a solvent capable of adequately dissolving the p-type organic semiconductor contained in the first organic semiconductor A from the standpoint that it can adjust the thickness of the intermediate layer 4c within an appropriate range and can intend to further improve the heat resistance and the sensitivity. Considering these standpoints, it is preferable to use a solvent containing chlorobenzene or o-dichlorobenzene as the second solvent.

Examples of the method of applying the second application solution are the same as those of the method of applying the first application solution. From the standpoint of forming the intermediate layer 4c adequately, spin coating, dip coating, or die coating is preferable.

In the aforementioned step, it is preferred that insolubilization treatment is not conducted against the surface on which the second application is applied (the surface of the first organic layer 4a that is opposite to the second electrode 2). Conventionally, when an organic photoelectric conversion element having a bulk heterojunction structure is produced, the insolubilization treatment has been generally conducted against the application surface prior to the application of the respective solutions even if plural kinds of solutions are to be used. By contrast, insolubilization treatment is not conducted purposefully in the present embodiment; thereby, a portion of the above-described application surface in the first organic layer is allowed to dissolve and the intermediate layer can be adequately formed. This will make it easy to produce an organic photoelectric conversion element having both of the heat resistance and the sensitivity at the same time.

Next, the second electrode 5 is formed on the second organic layer 4b. As the method of forming the second electrode 5, there is, for example, mentioned a vacuum film forming method such as electron-beam deposition, resistance heating deposition, or sputtering. The resistance heating deposition can suppress damages to the photoelectric conversion layer 4.

Thus far one embodiment of the method for producing an organic photoelectric conversion element according to the present invention has been described. However, the present invention is not limited to the above-described embodiment.

For example, the intermediate layer 4c and the second organic layer 4b may be formed by methods other than the one described above insofar as the effects associated with the present invention can be displayed. For example, a first solution comprising the first organic semiconductor A and the second organic semiconductor B is applied on the first organic layer 4a, followed by drying, to form the intermediate layer 4c; thereafter, a second solution comprising the second organic semiconductor B is applied on the intermediate layer 4c, whereby the intermediate layer 4c and the second organic layer 4b may be formed. In this case, the insolubilization treatment may be conducted against the surface of the first organic layer 4a that is opposite to the first electrode 2 prior to the application of the first solution; the insolubilization treatment may be conducted against the surface of the intermediate layer 4c that is opposite to the first electrode 2 prior to the application of the second solution.

Further, when the electron blocking layer 3 is not to be formed, the first application solution may be applied on the surface of the first electrode 2 opposite to the substrate 1 to form the first organic layer 4a. Still further, when a hole transport layer, an electron transport layer, or a hole transport layer is formed as the other layer described above, it may be for by a method similarly to the method of forming the electron blocking layer 3. Furthermore, when a layer having water vapor barrier property is formed on the second electrode 5 as the other layer described above, it may be, for example, formed according to a method of adhering the second electrode 5 and the water vapor barrier film by using a curable resin composition (e.g., UV-curable resin composition).

Also, the second electrode 5, the photoelectric conversion layer 4, the electron blocking layer 3, and the first electrode 2 may be formed on the substrate 1 in this order thereby to produce the organic photoelectric conversion element. In this case, a third solvent capable of dissolving the second organic semiconductor is used in the formation of the second electrode 2, and the above-described second solvent is used in the formation of the first organic layer. Note that examples of the third solvent include those of the first solvent and that the preferable solvents are the same.

Conventionally, when an organic photoelectric conversion element having a bulk heterojunction structure is produced, the formation of a photoelectric conversion layer with one kind of solution has been general. By contrast, in the above-described production method, two kinds of solutions differing with respect to the content ratio of the p-type organic semiconductor to the n-type organic semiconductor are used to form the photoelectric conversion layer. This can intend to improve both of the heat resistance and the sensitivity of the organic photoelectric conversion element.

EXAMPLES

The content of the present invention will be described in more detail hereinafter by reference to the examples and comparative examples; however, the present invention is not limited to the examples below.

Example 1

There was prepared a transparent conductive film where ITO as a first electrode was formed on a water vapor barrier film (a film provided with a $SiO_2$ coat on a PET film) which was a substrate. NiO was next vapor-deposited on the first electrode by the electron beam deposition to form an electron blocking layer with a thickness of 20 nm.

Next, a photoelectric conversion layer with a thickness of 200 nm was formed on the electron blocking layer. Specifically, a first organic semiconductor comprised of PDPP3T as a p-type organic semiconductor was first dissolved in chlorobenzene to prepare a first application solution. In so doing, the concentration of the first organic semiconductor (PDPP3T) in the first application solution was adjusted to 8 mg/ml. Subsequently, the surface of the electron blocking layer was treated by UV ozone treatment using an excimer lamp. After the first application solution was applied on the treated surface of the electron blocking layer according to spin coating, drying removed the first solvent to form a first organic layer. Next, a second organic semiconductor comprised of PDPP3T as a p-type organic semiconductor and PCBM as an n-type organic semiconductor was dissolved in chlorobenzene to form a second application solution. In so doing, the mass ratio of PDPP3T to PCMB in the second organic semiconductor was set to PDPP3T:PCBM=5:95 and the concentration of the second organic semiconductor (PDPP3T and PCBM) was adjusted to 32 mg/ml. Subsequently, after the second application was applied on the surface of the first organic layer by spin coating, drying removed the second solvent to form an intermediate layer and a second organic layer.

Next, according to the resistance heating deposition, Al was deposited on the second organic layer to form a second electrode with a thickness of 120 nm. Subsequently, a UV-curable resin composition was used to adhere a water vapor barrier film to the second electrode. Through the foregoing manipulations, the organic photoelectric conversion element of Example 1 was produced.

Example 2

Except that in the preparation of a second application solution, toluene was used in place of chlorobenzene, the organic photoelectric conversion element of Example 2 was produced in the same manner as Example 1.

Comparative Example 1 a second organic semiconductor comprised of PDPP3T as a p-type organic semiconductor and PCBM as an n-type organic semiconductor was dissolved in a mixed solvent of chlorobenzene and diiodooctane [chlorobenzene:diiodooctane=95:5 (volume fraction)] to prepare a solution. In so doing, the mass ratio of PDPP3T to PCMB in the second organic semiconductor was set to PDPP3T:PCBM=25:75, and the concentration of the second organic semiconductor (PDPP3T and PCBM) was adjusted to 32 mg/ml. Except that in the formation of a photoelectric conversion layer, a first organic layer was not formed and the aforementioned solution was used as the second application solution, the organic photoelectric conversion element of Comparative Example 1 was produced in the same manner as Example 1. The thickness of the photoelectric conversion layer was 180 nm. Note that because no first organic layer was formed in Comparative Example 1, no intermediate layer resulted to be formed.

Comparative Example 2

Except that no first organic layer was formed, the organic photoelectric conversion element of Comparative Example 2 was produced in the same manner as Example 2. The thickness of the photoelectric conversion layer was 130 nm. Note that because no first organic layer was formed in Comparative Example 2, no intermediate layer resulted to be formed.

Comparative Example 3

Except that no first organic layer was formed, the organic photoelectric conversion element of Comparative Example 2 was produced in the same manner as Example 1. The thickness of the photoelectric conversion layer was 100 nm. Note that because no first organic layer was formed in Comparative Example 3, no intermediate layer resulted to be formed.

Initial Sensitivity Evaluation

Figure 5:
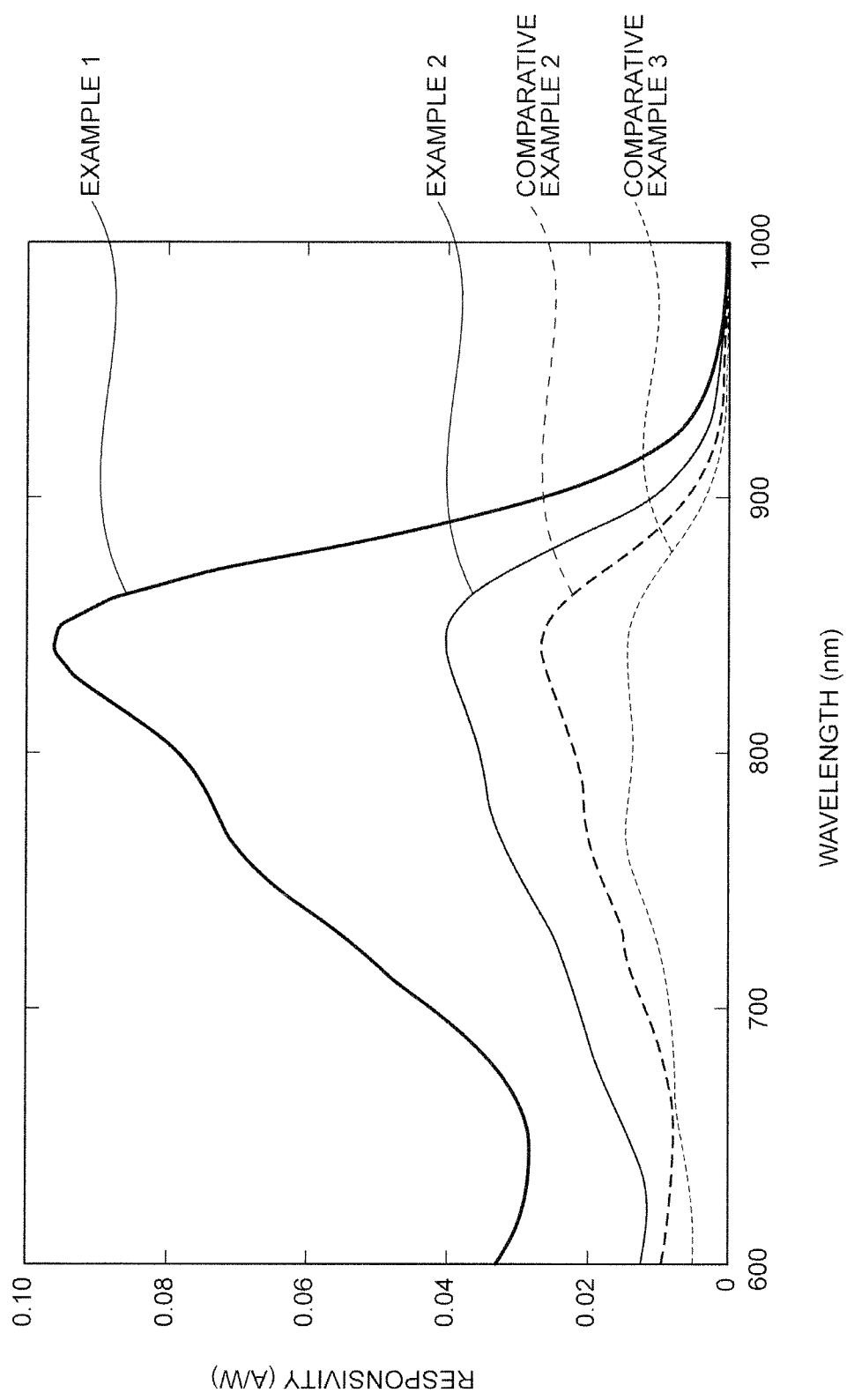
FIG. 5 is a chart of sensitivity spectra of the Examples and the Comparative Examples.

Spectral sensitivity spectra of the organic photoelectric conversion elements of the Examples and the Comparative Examples were measured with a spectral sensitivity measuring device (manufactured by Nikon Corporation; product name: Auto Scanner). The measured spectral sensitivity spectra are shown in FIGS. 4 and 5. As FIGS. 4 and 5 illustrate, the organic photoelectric conversion element of Example 1 wherein the photoelectric conversion layer has the first organic layer possessed far higher sensitivity than did the organic photoelectric conversion element of Comparative Example 2 wherein the photoelectric conversion layer is only comprised of the second organic layer; and the effect of sensitivity enhancement, which was 360% at a wavelength of 840 nm, was obtained. As FIG. 5 illustrates, the organic photoelectric conversion element of Example 2 wherein the photoelectric conversion layer has the first organic layer possessed higher sensitivity than did the organic photoelectric conversion element of Comparative Example 2 wherein the photoelectric conversion layer is only comprised of the second organic layer; and the effect of sensitivity enhancement, which was 270% at a wavelength of 840 nm, was obtained. As described above, it was confirmed that the introduction of the first organic layer improved the sensitivity. It was also confirmed that in Example 1, which employed chlorobenzene as the second solvent, the effect of improving the sensitivity was superior to Example 2, which employed toluene as the second solvent.

Heat Resistance Evaluation

Based on the relationship between the heat treatment time and the relative change in sensitivity (FIG. 6), the heat resistances of the organic photoelectric conversion elements of the Examples and the Comparative Examples were evaluated. Specifically, the organic photoelectric conversion elements of the Examples and the Comparative Examples were treated at 60° C. for 100 hours under a nitrogen atmosphere. In so doing, the sensitivity of the organic photoelectric conversion element was measured at a point when a predetermined time elapsed after the heat treatment had started. In the evaluation, one having sensitivity of 80% or more in terms of the initial sensitivity after the lapse of 100 hours was determined to be good in heat resistance. This is premised on the temperature increase during transportation of the organic photoelectric conversion elements: Considering that the temperature rises to the vicinity of 60° C. in a container on board during the passage under the equator, the aforementioned evaluation standard was employed. Note that the sensitivity measurement was carried out in the same manner as the initial sensitivity evaluation.

As is shown FIG. 6, the organic photoelectric conversion element of Example 1 had sensitivity of more than 80% in terms of the initial sensitivity even after the lapse of 100 hours; thus, it was confirmed to be an organic photoelectric conversion element which had a smaller decrease in sensitivity relative to the heat treatment time than did the organic photoelectric conversion element of Comparative Example 1. Furthermore, it was confirmed that the organic photoelectric conversion element of Example 2 was one which had a smaller decrease in sensitivity relative to the heat treatment time than did the organic photoelectric conversion element of Comparative Example 1, although this is not shown in the figure. As described above, it was confirmed that the configuration of the present invention improves the heat resistance of the organic photoelectric conversion element.

As described thus far, the organic photoelectric conversion elements provided with both of the sensitivity and the heat resistance at the same time were obtained in Examples 1 and 2.

REFERENCE SIGNS LIST

1 . . . substrate; 2 . . . first electrode; 3 . . . electron blocking layer; 4 . . . photoelectric conversion layer, 4a . . . first organic layer, 4b . . . second organic layer; 4c . . . intermediate layer; 5 . . . second electrode; 6 . . . hole blocking layer; 10 . . . organic photoelectric conversion element, A . . . first organic semiconductor, B . . . second organic semiconductor.

What is claimed is:

1. An organic photoelectric conversion element comprising:
   a first electrode;
   a photoelectric conversion layer disposed on the first electrode; and
   a second electrode disposed on the photoelectric conversion layer, the photoelectric conversion layer having:
      a first organic layer consisting of a first organic semiconductor;
      a second organic layer consisting of a second organic semiconductor, the second organic layer being disposed at a side of the second electrode relative to the first organic layer; and
      an intermediate layer comprising the first organic semiconductor and the second organic semiconductor, the intermediate layer being between the first organic layer and the second organic layer and reaching each of the first organic layer and the second organic layer,
   the thickness of the second organic layer being greater than the sum of the thickness of the first organic layer and the thickness of the intermediate layer,
   the first organic semiconductor comprising principally a p-type organic semiconductor,
   the second organic semiconductor comprising principally an n-type organic semiconductor and comprising a p-type organic semiconductor,
   wherein the content of the n-type organic semiconductor in the second organic semiconductor is greater than 75% by mass based on the total mass of the second organic semiconductor,
   wherein the thickness of the second organic layer is 50-300 nm, and
   wherein the sum of the thickness of the first organic layer and the thickness of the intermediate layer is 10-40 nm.

2. The organic photoelectric conversion element according to claim 1, wherein the content of the p-type organic semiconductor and the content of an n-type organic semiconductor are constant in the first organic layer.

3. The organic photoelectric conversion element according to claim 2, wherein the content of the p-type organic semiconductor in the first organic semiconductor is greater than 50% by mass or more based on the total mass of the first organic semiconductor.

4. The organic photoelectric conversion element according to claim 3, wherein the thickness of the first organic layer is from 5 to 20 nm.

5. The organic photoelectric conversion element according to claim 2, wherein the content of the p-type organic semiconductor in the first organic semiconductor is greater than 80% by mass or more based on the total mass of the first organic semiconductor.

6. The organic photoelectric conversion element according to claim 5, wherein the thickness of the first organic layer is from 5 to 20 nm.

7. The organic photoelectric conversion element according to claim 1, wherein at least one of the first organic semiconductor and the second organic semiconductor comprises a compound having a diketopyrrolopyrrole skeleton as the p-type organic semiconductor.

8. The organic photoelectric conversion element according to claim 1, wherein the second organic semiconductor comprises a fullerene derivative as the n-type organic semiconductor.

9. The organic photoelectric conversion element according to claim 1, wherein the p-type organic semiconductor contained in the first organic semiconductor is the same as the p-type organic semiconductor contained in the second organic semiconductor.

10. The organic photoelectric conversion element according to claim 1, further comprising an electron blocking layer disposed between the first electrode and the photoelectric conversion layer.

11. The organic photoelectric conversion element according to claim 1, further comprising a hole blocking layer disposed between the photoelectric conversion layer and the second electrode.

12. The organic photoelectric conversion element according to claim 1, wherein the content of the p-type organic semiconductor and the content of the n-type organic semiconductor are constant in the second organic layer.

13. The organic photoelectric conversion element according to claim 1, wherein the content of the n-type organic semiconductor in the second organic semiconductor is 80% by mass or more based on the total mass of the second organic semiconductor.

14. A method for producing an organic photoelectric conversion element according to claim 1, the method comprising the steps of:
   applying a solution comprising the first organic semiconductor and a first solvent capable of dissolving the first organic semiconductor on the first electrode to form the first organic layer; and
   applying a solution comprising the second organic semiconductor and a second solvent capable of dissolving the first organic semiconductor and the second organic semiconductor on the first organic layer to form the intermediate layer and the second organic layer.

15. The method for producing an organic photoelectric conversion element according to claim 14, wherein the second solvent comprises at least one selected from the group consisting of chlorobenzene and o-dichlorobenzene.

16. A method for producing an organic photoelectric conversion element according to claim 1, the method comprising the steps of:

applying a solution comprising the second organic semiconductor and a third solvent capable of dissolving the second organic semiconductor on the second electrode to form the second organic layer; and applying a solution comprising the first organic semiconductor and a second solvent capable of dissolving the first organic semiconductor and the second organic semiconductor on the second organic layer to form the intermediate layer and the first organic layer.

17. The method for producing an organic photoelectric conversion element according to claim 16, wherein the second solvent comprises at least one selected from the group consisting of chlorobenzene and o-dichlorobenzene.

* * * * *